(12) United States Patent
Barakat et al.

(10) Patent No.: US 6,363,241 B1
(45) Date of Patent: Mar. 26, 2002

(54) MUTING SYSTEMS AND METHODS FOR COMMUNICATION TRANSCEIVERS

(75) Inventors: Nader A. Barakat, Moorpark; Carlos Briceno, Ventura; John L. Ponti, Camarillo, all of CA (US)

(73) Assignee: California Amplifier, Inc., Camarillo, CA (US)

( * ) Notice: Subject to any disclaimer, the term of this patent is extended or adjusted under 35 U.S.C. 154(b) by 0 days.

(21) Appl. No.: 09/549,316

(22) Filed: Apr. 13, 2000

(51) Int. Cl.[7] ................................. H04B 1/38
(52) U.S. Cl. .................. 455/63; 455/3.05; 455/115; 455/127; 455/572
(58) Field of Search .................. 455/3.05, 78, 79, 455/82, 83, 115, 116, 127, 63, 67.3, 67.1, 68, 522, 572, 574; 375/219

(56) References Cited

U.S. PATENT DOCUMENTS

| | | | |
|---|---|---|---|
| 4,232,393 A | | 11/1980 | Kumaoka |
| 4,430,742 A | | 2/1984 | Milleker et al. |
| 5,222,253 A | | 6/1993 | Heck |
| 5,276,703 A | | 1/1994 | Budin et al. |
| 5,408,693 A | | 4/1995 | Alton et al. |
| 5,778,026 A | * | 7/1998 | Zak ........................... 455/127 |
| 5,794,119 A | | 8/1998 | Evans et al. |
| 5,809,431 A | * | 9/1998 | Bustamante et al. ........... 455/63 |
| 5,884,181 A | * | 3/1999 | Arnold et al. .................. 455/63 |
| 5,963,587 A | | 10/1999 | Kumagai |
| 5,995,812 A | | 11/1999 | Soleimani et al. |
| 5,995,853 A | * | 11/1999 | Park .......................... 455/115 |
| 6,021,318 A | | 2/2000 | Schaffer |
| 6,078,790 A | | 6/2000 | Oh et al. |
| 6,112,061 A | * | 8/2000 | Rapeli .......................... 455/83 |
| 6,122,488 A | | 9/2000 | Leizerovich |
| 6,229,995 B1 | * | 5/2001 | Lee .............................. 455/127 |

OTHER PUBLICATIONS

Baylin Frank, et al., *Wireless Cable and SMTV*, Baylin Publications, 1992, Boulder, Colorado, pp. 229–231.
Newton, Harry, *Newton's Telecom Dictionary*, Miller Freeman Inc., 1999, New York, pp. 93, 212, 213 and 402 (selected terms, thereon).

* cited by examiner

*Primary Examiner*—Lester G. Kincaid
(74) *Attorney, Agent, or Firm*—Koppel & Jacobs

(57) ABSTRACT

Muting systems and methods are described that reduce noise signals that are received in a communication hub which communicates with indoor units (IDUs) of a plurality of communication customers. The systems and methods reduce transmitter signal gain when uplink communication signals to the transmitter input port are less than a predetermined threshold. Accordingly, accumulated noise signals at the communication hub are reduced and the system performance of the communication hub is not degraded.

27 Claims, 4 Drawing Sheets

MUTING SYSTEMS AND METHODS FOR COMMUNICATION TRANSCEIVERS

BACKGROUND OF THE INVENTION

1. Field of the Invention

The present invention relates generally to communication systems.

2. Description of the Related Art

The need to provide broadband Internet access for both home and business has created several highly competitive technologies to capitalize on this ever-increasing demand. These competing technologies may be compared with reference to three main parameters: availability, cost and bandwidth.

For example, the most widespread Internet access to consumers has been via dial-up switching telephone networks. This technology provides data rates up to 56 kbps and is considered to be the lowest data rate service available. While this low data rate may be adequate for many home users, it has proven inadequate for Small Office/Home Office (SOHO) users as well as small and large commercial firms.

Recent advancements in digital signal processing and complex modulation schemes have enabled new technologies to provide higher data rate to consumers and businesses. Examples of such technologies are the Integrated Services Digital Network (ISDN) which provides data rates up to 128 kbps and T1 leased lines which provide data rates on the order of 1.44 Mbps. These services, however, are costly and may not be readily available to the general public.

More recently, Digital Subscriber Lines (DSL) technology has been developed that is capable of providing data rates up to 1 Mbps. This technology utilizes existing phone line networks in the home. The main disadvantage of this service, however, is its availability and a distance limitation between the Central Office (CO) of the Internet Service Provider (ISP) and the subscriber. This limitation is incurred due to signal deterioration over distance.

Fiber optics provides an extremely large bandwidth but this data transport medium is costly to install and is not readily available to consumers. Given the cost and technical difficulties of extending fiber optic lines into the home, the use of fiber optic lines has typically been limited to communication hubs (base stations) or CO sites. Consumers can then be wired to these communication hubs via coaxial cables. This combination of technologies is generally referred to as Fiber to Coax Hybrid (HFC).

In order to provide consumers with a return path to the ISP, cable networks must be upgraded and retrofitted with bi-directional devices to support two-way connectivity with the ISP. In the home, subscribers will require cable modems which are connected to their personal communications system (PCS). These devices allow the analog-to-digital conversion of data between the ISP and the subscriber. Although this technology provides high data rate access to the Internet, it is costly and, depending on the geographic location of the customer, it may not be readily available.

New advancements in RF and microwave technologies have emerged in response to the need for a data transport means which is readily available and that can provide data rates in excess of 1 Mbps at a competitive price. This enabling technology allows the use of high frequency microwave signals to carry modulated data over the air and for long distances that are generally limited by transmitter power and the terrain. Advancements in digital modulation schemes, digital compression, and forward error correction techniques have enhanced the data rates of this technology.

In order to provide additional microwave bandwidth, the Federal Communications Commission (FCC) has expanded the use of multipoint distribution service/instructional television fixed service/ multichannel multipoint distribution service (MDS/ITFS/MMDS) frequency bands (~2.1–2.7 GHz) to permit licensed operators to provide two-way voice/video/data services to their subscribers. This ruling has enhanced the potential of providing high speed Internet access to consumers and businesses with high-speed data rates of up to 10 Mbps and at a competitive price. More importantly, this technology promises to substantially reduce set-up costs, both at the communication hub and at the consumer site which is generically referred to as customer premises equipment (CPE).

These technologies can reach subscribers who would otherwise not have access to the Internet because of their geographic locations. In order to receive this service over the air, a service provider typically provides an outdoor unit (ODU) to each subscriber. The ODU is directed towards the communication hub so that it can:

1) receive incoming data/programming (e.g. over the MMDS signal band) via a directional receive antenna which is aimed at the service provider's transmit site—the ODU downconverts this incoming high frequency to an intermediate frequency (IF), which is sent to an indoor unit (IDU) such as a modem via a coaxial cable, and 2) upconvert and transmit an IF signal carrying modulated data from the IDU to a high frequency carrier (e.g. over the MDS signal band)—the ODU must amplify the transmitted signals sufficiently to reach the communication hub.

Because this ODU simultaneously functions as transmitter and receiver, it is commonly referred to as a transceiver. The present invention recognizes, however, that when each subscriber's transciever is transmitting signals, it also transmits noise to the communication hub. As the number of subscribers increases, the accumulated noise in the hub's receiver will begin to degrade system performance and, accordingly, the number of subscribers will have to be limited.

SUMMARY OF THE INVENTION

The present invention is directed to transceiver systems and methods for reducing noise signals that are received in a communication hub which communicates with indoor units (IDUs) of a plurality of communication customers.

These goals are achieved with a method embodiment in which:

a) downlink communication signals are coupled from the communication hub to the IDUs, b) with a signal gain, uplink communication signals from the IDUs are converted to upconverted uplink communication signals, c) the upconverted uplink communication signals are coupled to the communication hub, and d) the signal gain is reduced when the uplink communication signals have an amplitude less than a predetermined threshold that is selected to indicate an absence of uplink signal generation.

Accordingly, accumulated noise signals at the communication hub are reduced and the communication hub's performance is not degraded.

In one method embodiment, the signal gain is reduced in response to the uplink communication signals while in another embodiment, it is reduced in response to a gain-control signal from a respective IDU. In different method embodiments, the gain is reduced by reducing the gain of an amplifier element of the transceiver, by removing supply power from an amplifier element and/or by increasing loss in an attenuator element.

Transceiver embodiments are also described for realizing the methods of the invention.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
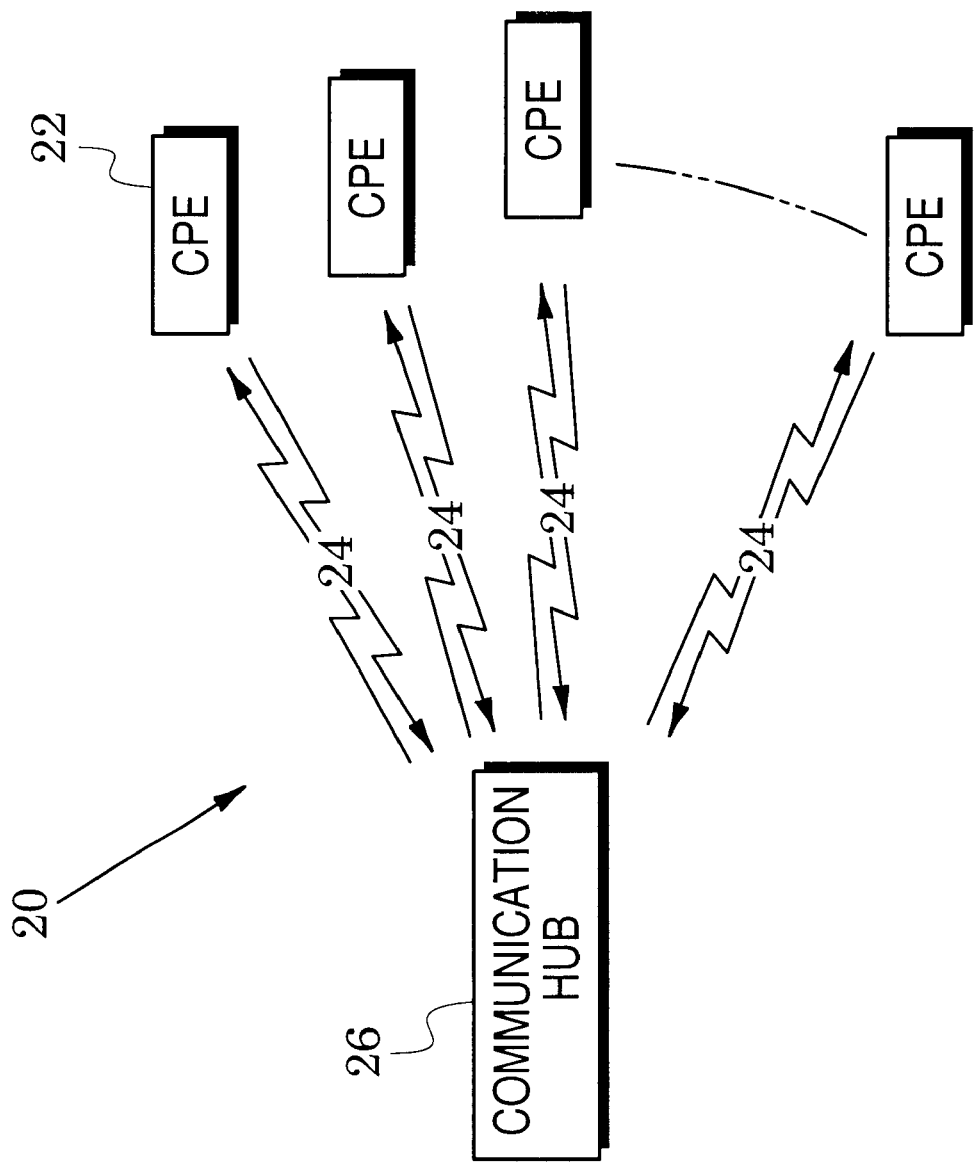
FIG. 1 is a block diagram of a wireless communication system that provides wireless communication between a communication hub and a plurality of CPEs.

A wireless communication system 20 is shown in FIG. 1. In the system 20, each of a plurality of CPEs 22 has a wireless two-way communication link 24 with a communication hub 26 and, accordingly, an antenna of each CPE 22 is directed at the communication hub 26 to establish a reliable link.

The communication system 20 is exemplary of systems that take advantage of widely used cellularized or sectorized networks in order to optimize and increase communication capacity and maximize service coverage. Because the communication hub may communicate with several hundred or even thousands of subscribers, the system 20 is often referred to as a point-to-multipoint (PMP) system.

Given the wide geographical distribution of subscribers and the random numbers of users at any given time, it is desirable to optimize network load distribution of transmitted power in order to provide good service quality. For reliable customer communication with the communication hub, a minimum carrier-to-interference ratio (C/I) must be maintained under all conditions at the communication hub's receiver.

This C/I figure of merit is determined by:
 a) received signal level from subscribers' transceivers,
 b) noise figure of the communication hub's receiver, and
 c) additional noise received at the communication hub which includes:
   1) noise from external interfering sources of other microwave links adjacent to the communication hub,
   2) noise from other communication hubs or sectors in the network which are emitting broad band noise and data to their respective subscribers, and, most importantly,
   3) broadband emitted noise from subscribers' transceivers.

As each transceiver transmits signals to the communication hub, it also transmits broadband noise that is primarily a function of the transmitter noise figure and the transmitter gain. Additionally, the IDU or modem generates its own broadband noise which is injected into the input of its transceiver. This noise will be upconverted with the desired signal and transmitted through the transceiver's transmit chain to the communication hub. This noise level is a function of modem design and potentially it can override the transceivers' output noise power.

Accordingly, an accumulative noise is received at the communication hub which is compounded as the number of subscribers increases. This accumulative noise will reduce the dynamic range of receivers within the communication hub and will degrade the C/I at the communication hub's demodulator.

As the number of subscribers increases further, the aggregate broadband noise "seen" by the communication hub will increase until a threshold point is reached whereby the total received noise power exceeds the communication hub's own inherent noise floor. This will further degrade the C/I required by the communication hub's demodulator to reproduce error-free signals and, accordingly, data loss and poor system performance will occur.

It has been determined from the above-described concepts that the total broadband noise received by the communication hub must be limited in order to maintain system performance. Because the overriding noise contributor is the accumulated noise transmitted by the CPEs, it has been recognized that system performance can be enhanced by turning off the transceiver when it is not in its transmit mode. In response to this recognition, a muting system is introduced into the CPEs 22 of FIG. 1.

Figure 2:
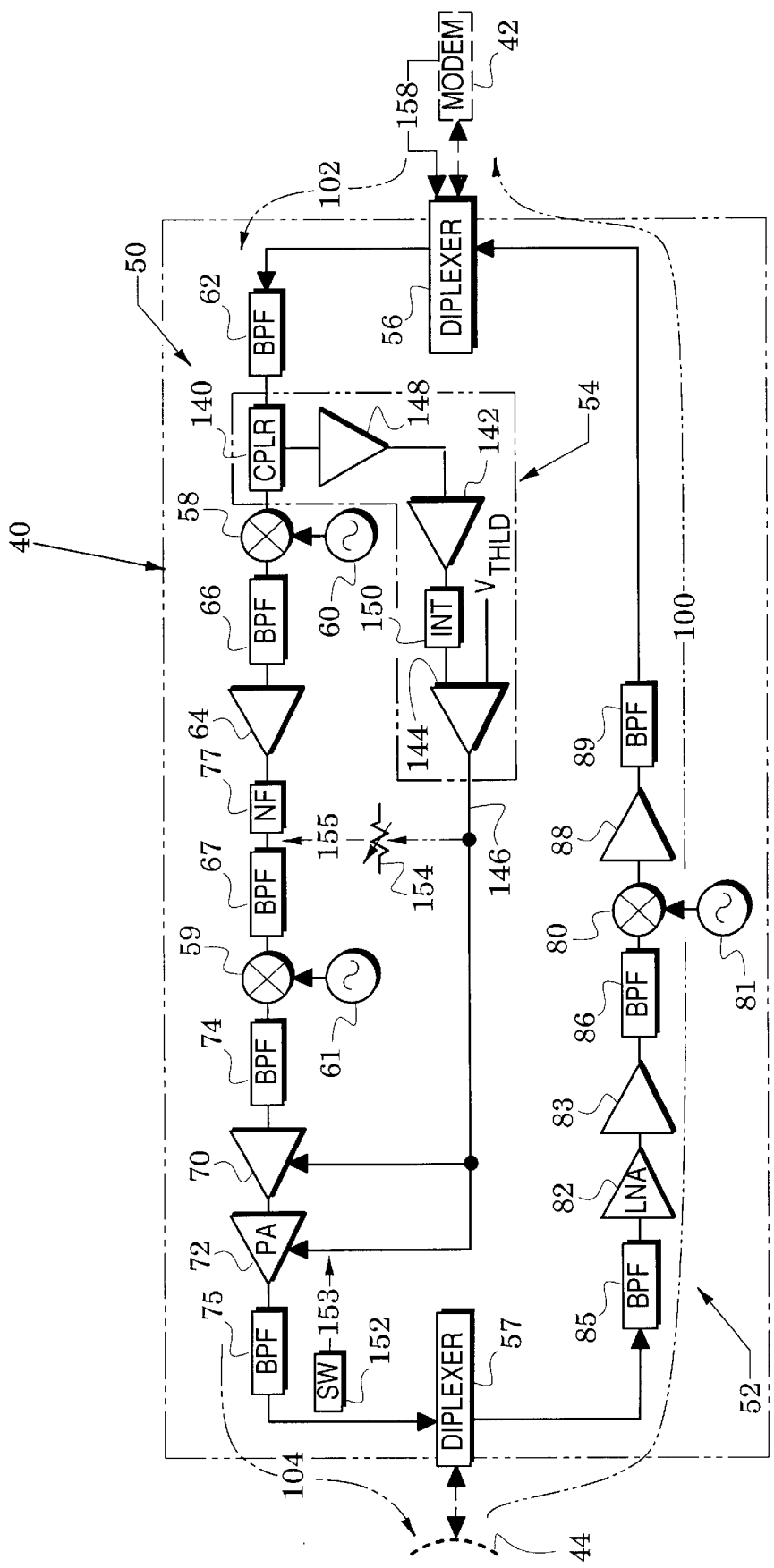
FIG. 2 is a block diagram of transceiver embodiments in the CPEs of FIG. 1.

An exemplary system is shown in FIG. 2 which illustrates a CPE transceiver 40 arranged between an IDU in the form of a modem 42 and an antenna 44 that couples the communication link (24 in FIG. 1) between the transceiver and its respective hub (26 in FIG. 1). The transceiver 40 includes a transmitter 50, a receiver 52 and a muting system 54 that is associated with the transmitter. An understanding of the muting system 54 will be enhanced by first examining the details of the exemplary transmitter 50 and receiver 52.

The transmitter 50 receives input communication signals from the modem 42 through a diplexer 56 and transmits upconverted versions of these signals to the antenna 44 through a diplexer 57. In the exemplary transmitter configuration of FIG. 2, the input signals are twice upconverted with first and second mixers 58 and 59 that receive local oscillator signals from respective local oscillators 60 and 61.

Preceding the first mixer, a bandpass filter (BPF) 62 is configured with an operational passband (e.g., 14–26 MHz) sufficient to pass the input signals. Between the first and second mixers 58 and 59, an IF amplifier 64 is coupled between IF bandpass filters 66 and 67 and this arrangement is configured with operational bandwidths (e.g., 116–128 MHz) sufficient to process the upconverted input signals.

A driver amplifier 70 drives a power amplifier 72 and they are positioned between bandpass filters 74 and 75. This arrangement is coupled between the second mixer 59 and the diplexer 57 and configured with operational bandwidths (e.g., 2150–2162 MHz) sufficient to process the final upconverted signals.

Isolation structures are preferably added to the transmitter to block spurious signals from exiting the diplexer 57. For example, a notch filter (NF) 77 is positioned in FIG. 2 after the first mixer 58 to remove spurious signals.

The receiver 52 has a mixer 80 that is driven by a local oscillator 81. Preceding the mixer 80, a low noise amplifier (LNA) 82 drives an amplifier 83. These amplifiers are coupled between bandpass filters 85 and 86 and this arrangement is configured with an operational passband (e.g., 2500–2686 MHz) sufficient to pass the input signals from the antenna 44.

Between the mixer 80 and the diplexer 56, an IF amplifier 88 is followed by a bandpass filter 89 and this arrangement is configured with an operational bandwidths (e.g., 222–408 MHz) sufficient to process the downconverted signals from the mixer 80.

For illustrative purposes, the transceiver 40 has been described to be compatible with an IDU (the modem 42) that receives "downlink" signals in a conventional signal band of 222–408 MHz and sends "uplink" signals over a signal band that is within a conventional uplink band of 5–45 MHz. In general, both uplink and downlink signals may contain voice, data, video and image content.

The transceiver has also been described to be compatible with a hub (26 in FIG. 1) that operates with exemplary output and input signal bandwidths of 2500–2686 MHz and 2150–2162 MHz MHz. In other words, the hub transmits in the MMDS signal band and receives in the MDS signal band. Accordingly, the transceiver 40 transmits in the MDS signal band and receives in the MMDS signal band. These are exemplary signal bands and the teachings of the invention can be practiced with various other arrangements of signal bands.

In operation, the transmitter 50 and receiver 52 process downlink communication signals, uplink communication signals and upconverted uplink communication signals which are respectively indicated in FIG. 2 by signal arrows 100, 102 and 104. In particular, the receiver 52 of the transceiver 40 is configured to couple downlink communication signals 100 from the communication hub (26 in FIG. 1) to an IDU within a respective CPE (22 in FIG. 1). Accordingly, the downlink communication signals 100 flow through the antenna 44, the diplexer 57, the receiver 52 and the diplexer 56. In addition, the downlink communication signals are downconverted as they proceed to the diplexer 57.

In contrast, the transmitter 50 is configured to convert uplink communication signals 102 from the IDU (in particular, from the modem 42) to upconverted uplink communication signals 104. The transmitter 50 then couples the upconverted uplink communication signals to the communication hub (26 in FIG. 1). Accordingly, the uplink communication signals 102 flow through the diplexer 57 to the bandpass filter 62 and the upconverted uplink communication signals 104 flow through the diplexer 57 to the antenna 44.

Figure 3A:
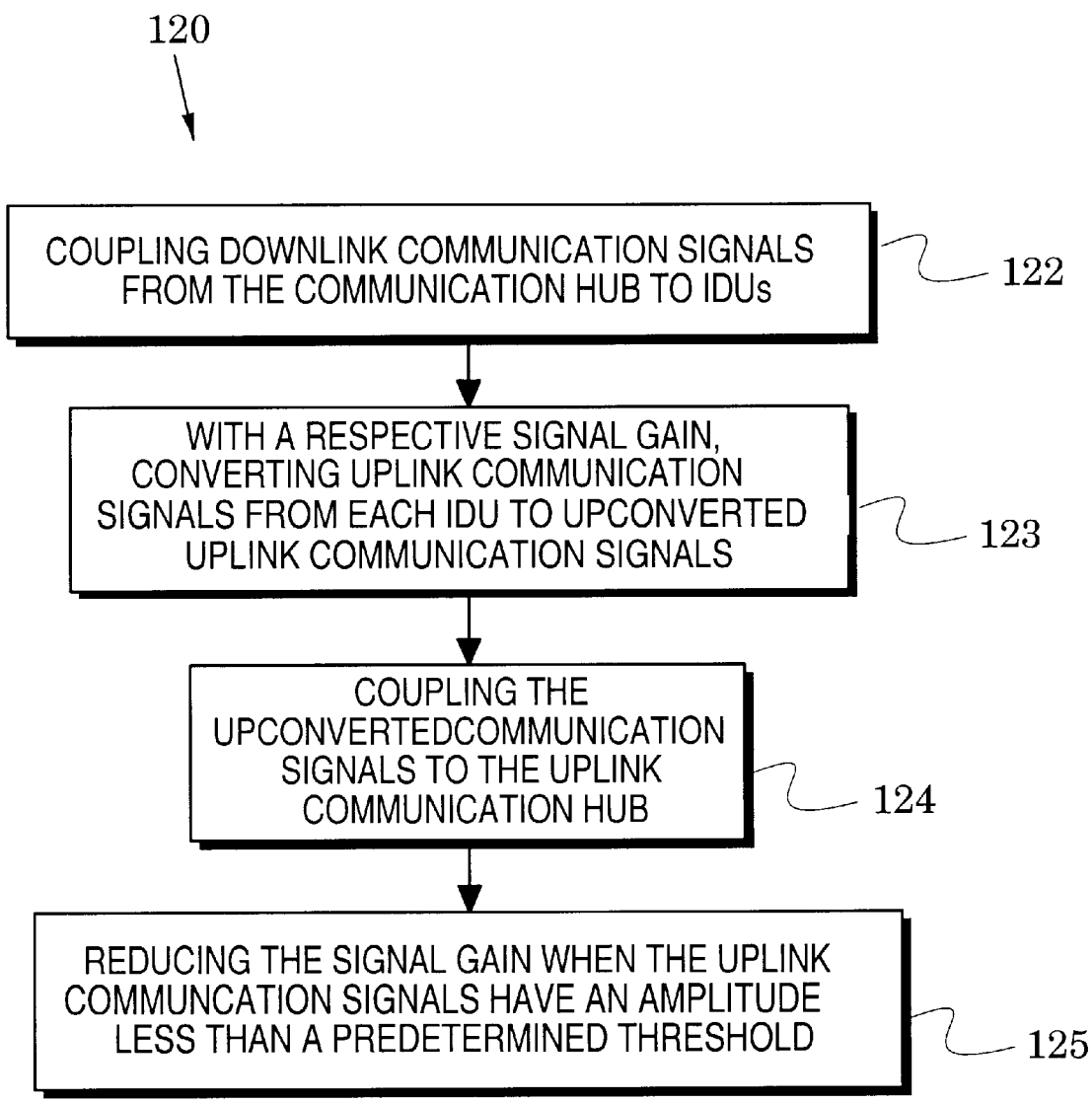
FIGS. 3A and 3B are flow charts that illustrate process steps in the communication system and transceiver of FIGS. 1 and 2.

The flow chart 120 of FIG. 3A includes process steps 122, 123 and 124 that summarize the above-described operation and the flow chart also adds a process step 125 in accordance with the present invention. In particular, process step 122 couples downlink communication signals (100 in FIG. 2) from the communication hub to a respective IDU. Process step 123 converts, with a respective signal gain, uplink communication signals (102 in FIG. 2) from each IDU to upconverted uplink communication signals (104 in FIG. 2). The upconverted uplink communication signals are then coupled to the communication hub in process step 124. The signal gain generally varies in accordance with the distance between each CPE (22 in FIG. 1) and the communication hub (26 in FIG. 1).

In process step 125, the signal gain of step 123 is reduced when the uplink communication signals (102 in FIG. 2) have an amplitude less than a predetermined threshold which is set to determine when the modem is not transmitting uplink signals. The magnitude of the signal gain is selected to be sufficient to reduce the noise signals that would otherwise be coupled out through the antenna (44 in FIG. 2) to the communication hub.

Because communication CPEs (e.g., the CPEs 22 of FIG. 1) typically transmit for only a portion (e.g., on the order of 30%) of the communication system's total operating time, process step 125 eliminates transmitted noise during the remaining portion (e.g., typically on the order of 70%) of the total operating time. This elimination significantly lowers the accumulated noise that is received in the receiver of the communication hub (26 in FIG. 1).

Figure 3B:
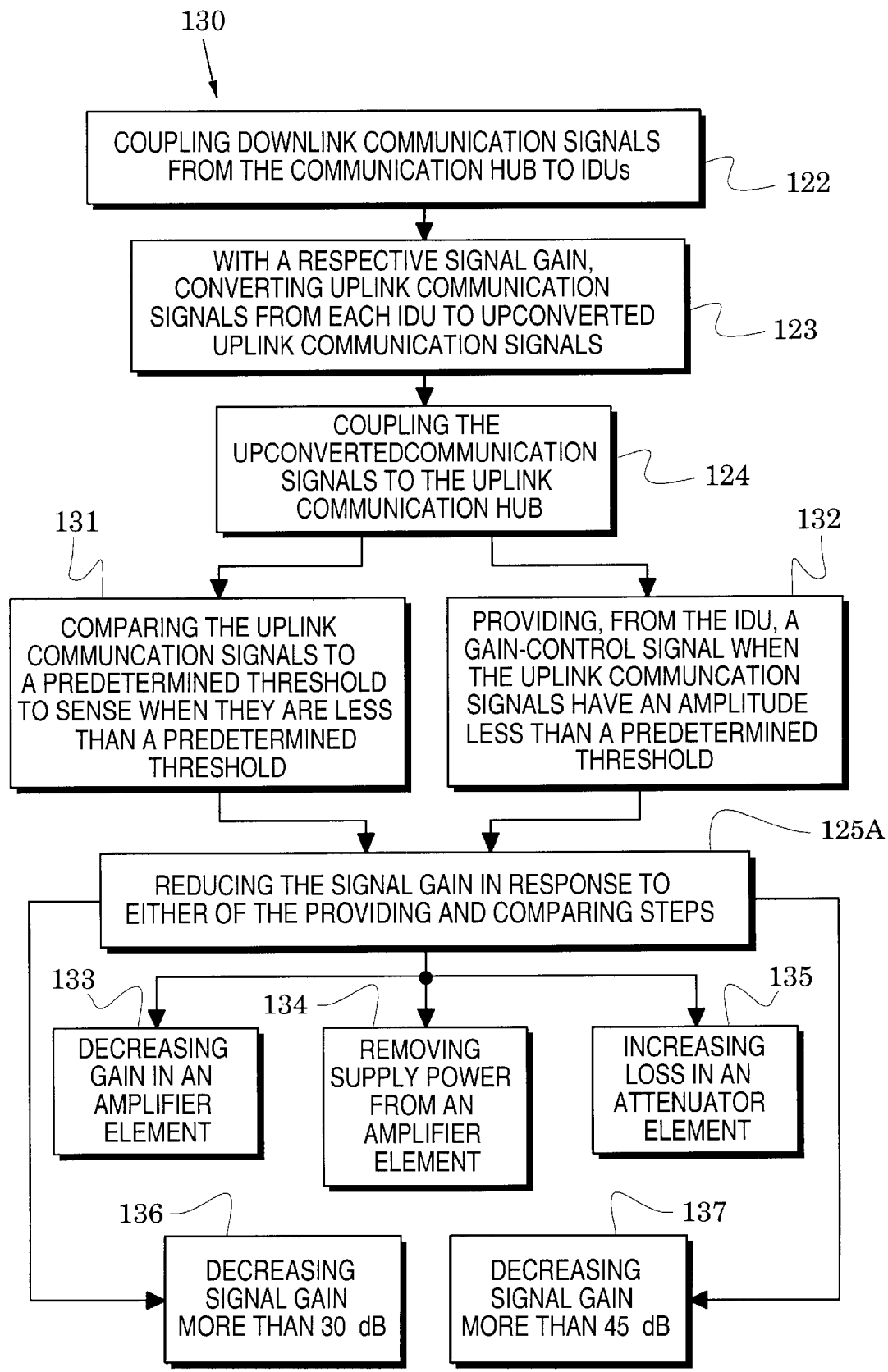

The flow chart 130 of FIG. 3B repeats the process steps 122–124, modifies the process step 125 to a step 125A and adds process steps 131–137 to illustrate various ways for practicing the teachings of the invention. Process steps 131 and 132 have been inserted between steps 124 and 125 to show exemplary ways of determining when the uplink communication signals (102 in FIG. 2) are less than the threshold and process steps 133–135 have been added to indicate exemplary ways of decreasing the signal gain.

In process step 131, the uplink communication signals are compared to a threshold signal (e.g., in a comparator) to sense when they are less than a predetermined threshold and the reducing step 125A is performed in response to this comparison. In process step 132, the IDU provides a gain-control signal that indicates when the amplitude of the uplink communication signals have dropped below the threshold (i.e., when the IDU is not transmitting signals). Process step 125A then reduces the signal gain in response to either selected one of the providing and comparing steps (steps 131 and 132).

In process steps 133 and 134, the signal gain is reduced by decreasing gain in an amplifier element (e.g., the power amplifier 72 in FIG. 2) and by removing supply power from an amplifier element. In process step 135, the signal gain is reduced by increasing loss in an attenuator element (e.g., the variable attenuator 154 in FIG. 2).

IDUs (e.g., the modem 42 of FIG. 2) typically generate uplink communication signals (102 in FIG. 2) with amplitudes in a range of −5 to +55 dBmV. The amplitude of the upconverted uplink communication signals (104 in FIG. 2) typically vary with distance from their respective communication hub (26 in FIG. 1) but generally fall in a range of 5 to 350 milliwatts.

The threshold signal level of process steps 131 and 132 is selected to indicate when the IDU is not transmitting. Although this level varies with the particular IDU, an exemplary threshold range for typical modems (such as the modem 42 of FIG. 2) is −10 to +10 dBmV.

Although the processes of FIG. 3B may be practiced with any gain reduction that is sufficient to reduce the transmitted noise that is transmitted to the communication hub (26 in FIG. 1), it is preferably reduced by at least 30 decibels (dB) as called out in process step 136 and more preferably, it is reduced by at least 45 (dB) as called out in process step 137.

Disabling the driver and power amplifiers (70 and 72 of FIG. 2) will generally accomplish the reduction of process step 137. Disabling of these RF gain/power elements has the additional advantage that device junction temperatures are reduced with a consequent enhancement of reliability.

The muting system 54 of FIG. 2 is configured to perform the process steps of FIGS. 3A and 3B. In particular, the muting system inserts a signal coupler 140 into the transmitter 50 to provide a sample of the uplink communication signals from the modem 42. Although this coupler can be anywhere along the upconversion path, it is shown in an exemplary position before the first mixer 58 and after the bandpass filter 62 which provides rejection of spurious signals. The bandpass filter also improves dynamic range by limiting broadband noise from the modem The coupler 140 has a small coupling value so that a small portion of the uplink communication signal 102 is directed to a signal detector 142 (e.g., a Schottky diode, a true RMS power detector or a logarithmic amplifier) which, in response, sends a detected signal to a signal comparator 144 (e.g., an operational amplifier). The comparator generates a mute signal on a signal line 146 in response to the detected signal and a threshold voltage $V_{thld}$. An amplifier 148 may be inserted before the detector 142 to enhance the sensitivity of the muting system 54. In addition, an integrator (INT) 150 may also be inserted after the detector 142 to condition the detected signal before application to the comparator 144.

In order to respond to the uplink communication signals from the modem 42 (as indicated by process step 131 of FIG. 3B), the threshold voltage $V_{thld}$ is selected and the comparator inputs are arranged so that a mute signal is generated on the signal line 146 when the detected sample of the uplink communication signals 102 exceeds the threshold voltage $V_{thld}$.

In accordance with process step 132 of FIG. 3B, the mute signal can instead be generated in response to a gain-control signal from the modem 42. Accordingly, FIG. 2 indicates a gain-control signal 158 that is provided to the diplexer 56 by the modem 42. This gain-control signal preferably has a frequency that is spaced from that of the uplink communication signals so that it is blocked by upstream bandpass filters of the transmitter and is passed to the signal detector 148.

The presence (or absence) of the gain-control signal can be sensed with various structures. An exemplary structure includes the comparator 144 which can generate a mute signal in response to the gain-control signal 158 when it is directed to the comparator by the coupler 140. It may be desirable to insert a bandpass filter after the coupler 140 to pass the gain-control signal but block the uplink communication signals. Alternatively, the gain-control signal 158 can be directly coupled between the modem 42 and the comparator 144.

In accordance with process step 133 of FIG. 3B, the mute signal on the signal line 146 is applied to an amplifier element such as the driver amplifier 70 and the power amplifier 72 to reduce their gain. Many amplifiers are provided with control pins that enable and disable amplifier operation when appropriate signals are applied to them. With such exemplary amplifiers, the signal line 146 would be coupled to their control pins so that they are disabled in response to the mute signal. Other conditioning elements (e.g., a power MOSFET) can be inserted into the signal line 146 to properly condition the mute signal for application to the amplifiers.

In accordance with process step 134 of FIG. 3B, the mute signal on the signal line 146 is applied to remove supply power from an amplifier element such as the driver amplifier 70 and the power amplifier 72. This is accomplished in the transmitter 50 by insertion of a switch (SW) 152 (e.g., a transistor switch) that interrupts the supply power in response to the mute signal on the signal line 146. This insertion is indicated by insertion arrow 153.

In accordance with process step 135 of FIG. 3B, the mute signal on the signal line 146 is applied to increase the loss in an attenuator element such as the variable or step attenuator 154 of FIG. 2. Although this element can be inserted anywhere in the transmitter 50, it is shown by insertion arrow 155 to be inserted between the first and second mixers 58 and 59.

The teachings of the invention may be used to communicate various types of communication signals (e.g., packet-based signals) over various signal bands (e.g., MMDS and MDS). When the teachings are used to process uplink and downlink communication signals that have a digital form, relevant portions of the muting system 54 of FIG. 2 (e.g., the detector 142) should be appropriately configured. The muting system 54 and associated transmitter elements must also be configured with a response time that is sufficient to prevent data loss.

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A transceiver system for reduction of noise signals that are received in a communication hub which communicates with indoor units (IDUs) of a plurality of communication customers, the system comprising:
   a transceiver having a receiver and a transmitter and wherein:
   a) said receiver couples downlink communication signals from said communication hub to a respective one of said IDUs; and
   b) said transmitter converts, with a signal gain, uplink communication signals from said respective IDU to upconverted uplink communication signals and couples said upconverted uplink communication signals to said communication hub; and
   a muting system that reduces said signal gain when said uplink communication signals have an amplitude less than a predetermined threshold;
   reduction of said gain thereby facilitating said reduction of noise signals.

2. The transceiver system of claim 1, wherein said muting system includes a comparator that compares said uplink communication signals to said threshold and said muting system reduces said signal gain in response to said comparator.

3. The transceiver system of claim 1, wherein said muting system reduces said signal gain in response to a gain-control signal from said IDU.

4. The transceiver system of claim 1, wherein said transmitter includes an amplifier element and said muting system is configured to reduce gain in said amplifier element.

5. The transceiver system of claim 1, wherein said transmitter includes an attenuator element and said muting system is configured to increase loss in said attenuator element.

6. The transceiver system of claim 1, wherein said transmitter includes an amplifier element and said muting system is configured to remove supply power from said amplifier element.

7. The transceiver system of claim 1, wherein said transmitter reduces said signal gain in response to a mute signal and said muting system includes:
   a detector that generates a detected signal in response to said uplink communication signals; and
   a comparator that generates said mute signal in response to said detected signal and a predetermined threshold signal $S_{thld}$ and wherein said comparator couples said mute signal to said transmitter.

8. The transceiver system of claim 7, wherein said transmitter includes a signal coupler that couples a sample of said uplink communication signals to said detector.

9. The transceiver system of claim 1, wherein said muting system reduces said signal gain in response to a gain-control signal from said IDU and said transmitter includes a signal coupler that couples said gain-control signal to said muting system.

10. The transceiver system of claim 1, wherein said muting system and said transmitter are configured to reduce said signal gain greater than 30 decibels.

11. The transceiver system of claim 1, wherein said muting system and said transmitter are configured to reduce said signal gain greater than 45 decibels.

12. A communication system, comprising:
a communication hub;
plurality of indoor units (IDUs);
a transceiver associated with each respective one of said IDUs, said transceiver having a transmitter and a receiver wherein:
   a) said receiver couples downlink communication signals from said communication hub to said respective IDU; and
   b) said transmitter converts, with a signal gain, uplink communication signals from said respective IDU to upconverted communication signals and couples said upconverted communication signals to said communication hub; and
a muting system in said transceiver that reduces said signal gain when said uplink communication signals have an amplitude less than a predetermined threshold;
reduction of said gain thereby facilitating said reduction of noise signals.

13. The communication system of claim 12 wherein said muting system includes a comparator that compares said uplink communication signals to said threshold and said muting system reduces said signal gain in response to said comparator.

14. The communication system of claim 12 wherein said muting system reduces said signal gain in response to gain-control signal from said IDU.

15. The communication system of claim 12, wherein said transmitter includes an amplifier element and said muting system is configured to reduce gain in said amplifier element.

16. The communication system of claim 12 wherein said transmitter includes an attenuator element and said muting system is configured to increase loss in said attenuator element.

17. The communication system of claim 12, wherein said transmitter includes an amplifier element and said muting system is configured to remove supply power from said amplifier element.

18. The communication system of claim 12, wherein said muting system and said transmitter are configured to reduce said signal gain greater than 30 decibels.

19. The communication system of claim 12, wherein said muting system and said transmitter are configured to reduce said signal gain greater than 45 decibels.

20. A method for reducing noise signals that are received in a communication hub which communicates with indoor units (IDUs) of a plurality of communication customers, the method comprising the steps of;
coupling downlink communication signals from said communication hub to said IDUs;
with a respective signal gain, converting uplink communication signals from each of said IDUs to upconverted uplink communication signals;
coupling said upconverted uplink communication signals to said communication hub; and
reducing said signal gain when said uplink communication signals have an amplitude less than a predetermined threshold;
said reduction of noise signals facilitated by reduction of said signal gain.

21. The method of claim 20, further including the steps of:
comparing said uplink communication signals to said predetermined threshold to sense when said uplink communication signals have an amplitude less than said threshold; and
reducing said signal gain in response to said comparing step.

22. The method of claim 20, further including the steps of:
from each of said IDUs, providing a gain-control signal when said uplink communication signals have an amplitude less than said threshold; and
reducing said signal gain in response to said gain-control signal.

23. The method of claim 20, wherein said reducing step includes the step of decreasing gain in an amplifier element of said transceiver.

24. The method of claim 20, wherein said reducing step includes the step of removing supply power from an amplifier element of said transceiver.

25. The method of claim 20, wherein said reducing step includes the step of increasing loss in an attenuator element of said transceiver.

26. The method of claim 20, wherein said reducing step includes the step of decreasing said signal gain by more than 30 decibels.

27. The method of claim 20, wherein said reducing step includes the step of decreasing said signal gain by more than 45 decibels.

* * * * *